(12) United States Patent
Shi et al.

(10) Patent No.: US 11,963,447 B2
(45) Date of Patent: Apr. 16, 2024

(54) METHOD FOR PREPARING THERMOELECTRIC THICK FILM

(71) Applicant: SHANGHAI INSTITUTE OF CERAMICS, CHINESE ACADEMY OF SCIENCES, Shanghai (CN)

(72) Inventors: Xun Shi, Shanghai (CN); Pengfei Qiu, Shanghai (CN); Zhiqiang Gao, Shanghai (CN); Lidong Chen, Shanghai (CN); Shiqi Yang, Shanghai (CN); Qingyu Yang, Shanghai (CN)

(73) Assignee: SHANGHAI INSTITUTE OF CERAMICS, CHINESE ACADEMY OF SCIENCES, Shanghai (CN)

(*) Notice: Subject to any disclaimer, the term of this patent is extended or adjusted under 35 U.S.C. 154(b) by 0 days.

(21) Appl. No.: 17/906,937

(22) PCT Filed: May 6, 2020

(86) PCT No.: PCT/CN2020/088680
§ 371 (c)(1),
(2) Date: Sep. 21, 2022

(87) PCT Pub. No.: WO2021/189602
PCT Pub. Date: Sep. 30, 2021

(65) Prior Publication Data
US 2023/0380287 A1 Nov. 23, 2023

(30) Foreign Application Priority Data
Mar. 23, 2020 (CN) .......................... 202010207506.5

(51) Int. Cl.
*H10N 10/01* (2023.01)
*H10N 10/852* (2023.01)

(52) U.S. Cl.
CPC ........... *H10N 10/01* (2023.02); *H10N 10/852* (2023.02)

(58) Field of Classification Search
CPC ............................ H10N 10/01; H10N 10/852
See application file for complete search history.

(56) References Cited

U.S. PATENT DOCUMENTS

2012/0312343 A1   12/2012   Van Vechten et al.

FOREIGN PATENT DOCUMENTS

| CN | 104772361 A | 7/2015 |
| CN | 107910431 A | 4/2018 |

(Continued)

OTHER PUBLICATIONS

Tang et al., CN-109319748-A, English Machine Translation. (Year: 2019).*

(Continued)

*Primary Examiner* — Tae-Sik Kang
(74) *Attorney, Agent, or Firm* — Alleman Hall & Tuttle LLP

(57) ABSTRACT

The present invention relates to a method for preparing a thermoelectric thick film. The method includes: determining a brittle-to-ductile transition temperature of a thermoelectric material; rolling the blocky thermoelectric material within a temperature range above the brittle-to-ductile transition temperature and below a melting point; parameters of the rolling being as follows: a linear speed of rollers is 0.01 mm/s to 10 mm/s, preferably 0.1 mm/s to 5 mm/s, and an amount of pressing each time of the rollers is controlled at 0.0005 mm to 0.1 mm, preferably 0.001 mm to 0.05 mm; repeating the rolling until a thermoelectric thick film with a specified thickness is obtained; and annealing the obtained thermoelectric thick film; a temperature of the annealing being 100° C. to 800° C., preferably 300° C. to 500° C., and a duration (Continued)

of the annealing being 10 to 500 hours, preferably 100 to 300 hours.

11 Claims, 7 Drawing Sheets

(56) References Cited

FOREIGN PATENT DOCUMENTS

| | | | |
|---|---|---|---|
| CN | 108242500 A | 7/2018 | |
| CN | 109319748 A * | 2/2019 | ........... C01B 19/007 |

OTHER PUBLICATIONS

Shi, X. et al., "Room-temperature ductile inorganic semiconductor," Nature Materials, vol. 17, May 2018, 7 pages.
Liang, J. et al., "Flexible thermoelectric: from silver chalcogenides to full-inorganic devices," Energy & Environmental Science, vol. 12, 2019, 8 pages.
Tyagi, K. et al., "Crystal Structure and mechanical properties of spark plasma sintered $Cu_2Se$: An efficient photovoltaic and thermoelectric material," Solid State Communications, vol. 207, 2015, 5 pages.

* cited by examiner

METHOD FOR PREPARING THERMOELECTRIC THICK FILM

TECHNICAL FIELD

The present invention relates to a method for preparing a thermoelectric thick film, which belongs to the fields of material preparation and material modification.

BACKGROUND

Thermoelectric materials can realize the mutual conversion between electric energy and thermal energy, and have attracted great attention in the fields of waste heat recovery, solid refrigeration, wearable devices, etc. Micro thermoelectric devices can utilize some small environmental temperature differences (such as body temperature) to generate electric energy, providing power for a system. Alternatively, thermoelectric materials can realize the auxiliary heat dissipation of electronic chips, the local cooling of a tiny area, etc. Alternatively, thermoelectric materials can serve as chip type sensors to realize the high-precision and high-speed measurement of thermal signals. Therefore, thermoelectric materials have a broad application prospect in the fields of wearable electronic devices, miniature refrigerators, sensors, etc.

A thermoelectric device is composed of an n-type thermoelectric arm and a p-type thermoelectric arm with a specified logarithm. Limited by the application space, the size of a micro thermoelectric device is small, and the height of each thermoelectric arm approximately ranges from 0.01 mm to 1 mm. The traditional "top-down" process of sintering-cutting is suitable for preparing samples with a height of more than 1 mm. However, when the height of the thermoelectric arms is less than 1 mm, the difficulty of precise cutting is greatly increased, and the sample loss rate is extremely high, so the industrial application cannot be satisfied.

Compared with the "top-down" process, "bottom-up" processes, such as molecular beam epitaxy, magnetron sputtering, thermal evaporation, chemical vapor deposition, and pulsed laser deposition, are suitable for preparing high-density thin films with a height lower than 0.01 mm to 0.05 mm and then preparing the high-density thin films into thermoelectric arms. However, thermoelectric thick films with a thickness greater than 0.01 mm to 0.05 mm are needed in order to prepare thermoelectric arms with a height greater than 0.01 mm to 0.05 mm. However, the aforementioned "bottom-up" film preparation methods are complex in process and time-consuming, and the equipment used is expensive and difficult to maintain, so they are not suitable for large-scale production. In addition, because thermoelectric thick films prepared by methods such as electrochemical deposition, inkjet printing and 3D printing, are low in density and poor in electric properties and have thermoelectric properties far lower than those of bulk thermoelectric materials, it is difficult to put them into real application. Therefore, at present, there is a lack of effective methods to prepare thermoelectric thick films with a height range of about 0.05 mm to 1 mm.

The rolling technology is a processing method widely applied in the field of metal processing, which has the advantages of simple equipment, high output, zero loss, etc. The schematic structural diagram of the rolling technology is shown in FIG. 1. In the process of rolling, a material is placed in the gap between rotating rollers, and is ductilely deformed due to the pressure of the rollers, so that its cross section is reduced and its length is increased. Although the rolling technology can be used to prepare metallic thick films with a continuously adjustable thickness ranging from 0.001 mm to 10 mm, most thermoelectric materials are inorganic nonmetallic materials under room temperature, and the inorganic nonmetallic materials are often brittle materials under room temperature, and therefore cannot bear significant ductile deformation (Nature Mater 17, 421-426 (2018)). At present, $Ag_2S$-based materials are the only inorganic nonmetallic ductile thermoelectric materials under room temperature (Energy Environ Sci 12, 2983-2990 (2019)). In the thermoelectric field, there is no report on micron-level thick film materials prepared by rolling.

SUMMARY

In view of the aforementioned problems, the present invention provides a simple and easy-to-implement method for preparing a thermoelectric thick film, including:
  determining a brittle-to-ductile transition temperature of a thermoelectric material;
  rolling the blocky thermoelectric material within a temperature range above the brittle-to-ductile transition temperature and below a melting point;
  parameters of the rolling being as follows: a linear speed of rollers is 0.01 mm/s to 10 mm/s, preferably 0.1 mm/s to 5 mm/s, and an amount of pressing of the rollers each time is controlled at 0.0005 mm to 0.1 mm, preferably 0.001 mm to 0.05 mm;
  repeating the rolling until a thermoelectric thick film with a specified thickness is obtained; and
  annealing the obtained thermoelectric thick film; a temperature of the annealing being 100° C. to 800° C., preferably 300° C. to 500° C., and a duration of the annealing being 10 to 500 hours, preferably 100 to 300 hours.

Realizing that the brittle-to-ductile transition temperature of a thermoelectric material can be utilized, the present invention proposes for the first time that the thermoelectric material is rolled within a range between its brittle-to-ductile transition temperature and a temperature above the brittle-to-ductile transition temperature and below a melting point, overcoming the technical prejudice that thermoelectric materials are usually not suitable for rolling because of brittleness, and that technological parameters of rolling are controlled, so that the deformation of the thermoelectric material in the thickness direction can be greater than 99% and the deformation in the rolling direction be greater than 1,000%, and thereby micron-level and millimeter-level thermoelectric thick films can be obtained by the simple rolling method. Moreover, according to the present invention, since annealing is carried out after rolling, the thermoelectric properties of the obtained thermoelectric thick film can be restored to be equivalent to those of the blocky thermoelectric material before rolling.

Preferably, a method for determining the brittle-to-ductile transition temperature of a thermoelectric material includes: carrying out a three-point bending mechanics experiment on the thermoelectric material by using a universal temperature-varying material testing machine, continuously increasing a testing temperature of the mechanics experiment from room temperature until the thermoelectric material is ductilely deformed, and defining the lowest experimental temperature corresponding to a strain of the thermoelectric material being greater than or equal to 5% as the brittle-to-ductile transition temperature of the thermoelectric material. The ductility of all inorganic materials increases with the increase of temperature. The transition temperature is the lowest temperature required to reach a strain of 5%, and rolling can be carried out above the transition temperature and below the melting point.

Preferably, the method for determining the brittle-to-ductile transition temperature of the thermoelectric material may also include: rolling the thermoelectric material, continuously increasing a temperature of the rolling from room temperature until the thermoelectric material is ductilely deformed but not broken, and defining this temperature as the brittle-to-ductile transition temperature of the thermoelectric material.

The blocky thermoelectric material in the present invention may be selected from one of the following materials:
(1) $Cu_wAg_{2-w}S_xSe_yTe_z$ and doped, solid solution and modified products thereof, where $0 \leq w \leq 2$, $0 \leq x \leq 1$, $0 \leq y \leq 1$, $0 \leq z \leq 1$, and $x+y+z=1$;
(2) $Bi_{2-c}Sb_cTe_{3-d}Se_d$ and doped, solid solution and modified products thereof, where $0 \leq c \leq 2$ and $0 \leq d \leq 3$;
(3) MgAgSb and doped, solid solution and modified products thereof; and
(4) $Mg_3Sb_2$ and doped, solid solution and modified products thereof.

Preferably, an initial thickness of the blocky thermoelectric material is 0.01 mm to 100 mm.

Preferably, during the rolling, the temperature of the rollers and the temperature of the thermoelectric material are detected, and both are controlled to be within the brittle-to-ductile transition temperature range of the thermoelectric material. Therefore, during the whole rolling process, the thermoelectric material is kept in a ductile state, so that it can be continuously rolled to deform.

Preferably, the rolling is repeated 2 to 100 times, preferably 5 to 30 times. A desired thickness can be obtained in a simple way by the control of the amount of pressing in each rolling in combination with the number of times of rolling.

Preferably, the atmosphere of the rolling is an air atmosphere, a nitrogen atmosphere, a vacuum atmosphere, or an inert atmosphere, and the inert atmosphere is an argon atmosphere and/or a helium atmosphere.

Preferably, the heating rate and/or cooling rate of the annealing is 0.01° C./s to 1,000° C./s, preferably 1° C./s to 20° C./s.

The thickness of the thermoelectric thick film prepared according to the aforementioned method is 0.0001 mm to 1 mm. The present invention provides a feasible and simple preparation method for micron-level to millimeter-level thermoelectric thick films.

Effect of the Present Invention

The method for preparing a thermoelectric thick film based on the rolling technology under controlled temperature according to the present invention can realize the great rolled deformation of various thermoelectric materials. Even though the ductility of a thermoelectric material is extremely poor under room temperature, great rolled deformation can still be realized. As shown in FIG. 2, the present invention can roll $Cu_2Se$ and MgAgSb without ductility under room temperature into large-area thick films with a thickness of 0.01 mm. Moreover, the present invention further anneals the prepared thermoelectric thick film through a heat treatment process to obtain a thermoelectric thick film with excellent and controllable properties equivalent to those of the blocky thermoelectric material.

DETAILED DESCRIPTION OF PREFERRED EMBODIMENTS

Figure 1:
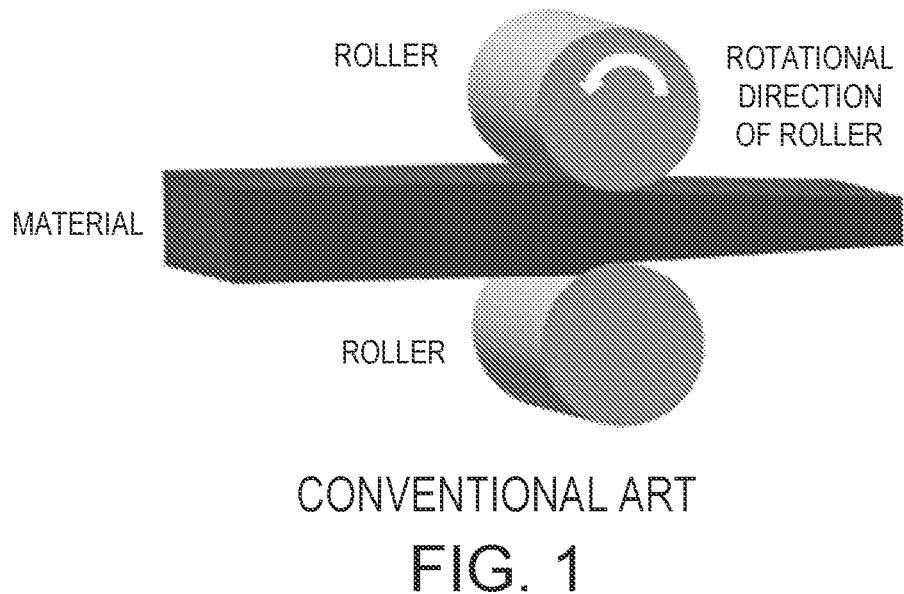
FIG. 1 shows a schematic structural diagram of a roller press.

The present invention will be further illustrated by the following embodiments below, and it should be understood that the following embodiments are only used to illustrate the present invention rather than to limit it.

In the present disclosure, the inventor made an in-depth study on the temperature-ductility relationships of a variety of thermoelectric materials, and found for the first time that under the condition of controlling the temperature, the thermoelectric materials can be subjected to great ductile deformation by rolling, breaking through the limitation of brittleness of the materials under room temperature. The deformation of the thermoelectric material in the thickness direction may be greater than 99% and the deformation in the rolling direction be greater than 1,000%, ultimately obtaining a thermoelectric thick film with a controllable thickness.

In an alternative embodiment, the method is suitable for not only thermoelectric materials with a compressive strain greater than 10% under room temperature which can be deformed significantly, but also thermoelectric materials which will not be ductilely deformed significantly under room temperature (i.e., thermoelectric materials with a compressive strain of less than 10% which cannot be rolled directly). For example, it should be understood that materials applicable to the present invention include, but are not limited to, the following materials: (1) $Ag_wCu_{2-w}S_xSe_yTe_z$ and doped, solid solution and modified products thereof, where $0 \leq w \leq 2$, $0 \leq x \leq 1$, $0 \leq y \leq 1$, $0 \leq z \leq 1$, and $x+y+z=1$; (2) $Bi_{2-c}Sb_cTe_{3-d}Se_d$ and doped, solid solution and modified products thereof, where $0 \leq c \leq 2$ and $0 \leq d \leq 3$; (3) MgAgSb and doped, solid solution and modified products thereof; (4) $Mg_3Sb_2$ and doped, solid solution and modified products thereof.

The thermoelectric thick film prepared by the present invention has excellent properties, which are equivalent to those of the bulk thermoelectric material. Moreover, the method is simple, easy to implement, easy for preparation in batches, and suitable for industrial production. The method for preparing a thermoelectric thick film will be illustrated below.

The brittle-to-ductile transition temperature of a thermoelectric material to be rolled is determined first. Specifically, there are two methods: Method 1: A three-point bending mechanics experiment is carried out on the thermoelectric material under the condition of high temperature by using a universal temperature-varying material testing machine as an experimental apparatus. The experimental temperature is continuously increased from room temperature until the material is subjected to significant ductile deformation. The lowest experimental temperature corresponding to the strain of the thermoelectric material greater than or equal to 5% is taken as the brittle-to-ductile transition temperature of the material. Method 2: The thermoelectric material is rolled under the condition of high temperature. The temperature of rolling is continuously increased from room temperature until the thermoelectric material can be rolled (ductilely deformed) but not broken, and thereby the brittle-to-ductile transition temperature and rolling temperature of the material are determined.

The blocky thermoelectric material (or referred to as the bulk thermoelectric material) is rolled by using a roller press under the condition of the rolling temperature being greater than or equal to the brittle-to-ductile transition temperature, obtaining the thermoelectric thick film with a controllable thickness.

The roller press is a commonly used machine with two or more rollers arranged in a certain form which can press and stretch a material into a certain thickness and shape under a certain temperature. Its structure is shown in FIG. 1.

In an alternative embodiment, the rolling temperature of the blocky thermoelectric material during rolling is determined by the brittle-to-ductile transition temperature of the thermoelectric material used. In the process of rolling, the blocky thermoelectric material is not rolled until it is heated to a required temperature. The rollers of the roller press may also be heated to the required temperature, and the blocky thermoelectric material is heated by using the rollers before and during rolling. For example, if the components of the blocky thermoelectric material are $Ag_wCu_{2-w}S_xSe_yTe_z$ and doped, a solid solution, and modified products thereof, the rolling temperature may be room temperature to 400° C., preferably room temperature to 240° C., more preferably room temperature to 200° C. If the components of the blocky thermoelectric material are $Bi_{2-c}Sb_cTe_{3-d}Se_d$ and doped, solid solution and modified products thereof, the rolling temperature may be 200° C. to 350° C. If the components of the blocky thermoelectric material are MgAgSb and doped, solid solution and modified products thereof, the rolling temperature may be 200° C. to 450° C., preferably 200° C. to 430° C. (e.g. 350° C., 400° C., 430° C., etc.). If the components of the blocky thermoelectric material are $Mg_3Sb_2$ and doped, solid solution and modified products thereof, the rolling temperature may be 240° C. to 400° C., preferably 300° C. to 400° C.

In alternative embodiments, the initial thickness of the bulk thermoelectric material may be 0.01 mm to 100 mm, generally 0.2 mm to 10 mm.

In the process of rolling, the linear speed of the rollers is controlled at 0.01 mm/s to 10 mm/s, preferably 0.1 mm/s to 5 mm/s. The amount of pressing of the rollers each time is adjusted at 0.0005 mm to 0.1 mm, preferably 0.001 mm to 0.05 mm. Moreover, each time when the rollers press, the bulk thermoelectric material is rolled 1 to 100 times, preferably, 5 to 30 times. The number of times of pressing includes, but is not limited to, 1. It is only necessary to roll the bulk thermoelectric material to form a thermoelectric thick film with a thickness of 0.0001 mm to 1 mm. The atmosphere of rolling may be air, helium, argon, nitrogen, or vacuum.

According to the present invention, through a large number of studies on the annealing process, it is discovered for the first time that annealing can regulate thermoelectric properties of rolled thermoelectric thin films. Specifically, after rolling, the obtained thermoelectric thick film may be selectively annealed and modified in another way, so as to regulate the material properties. Heat treatment (annealing) can effectively regulate the thermoelectric properties of the thermoelectric thick film. The temperature range of heat treatment may be 100° C. to 800° C., preferably 300° C. to 500° C., and the temperature-keeping time is 10 to 500 hours, preferably 100 to 300 hours. The heating rate and cooling rate of heat treatment may be between 0.01° C./s and 1,000° C./s, preferably between 1° C./s and 20° C./s. For example, if the components of the blocky thermoelectric material are $Cu_wAg_{2-w}S_xSe_yTe_z$ and doped, solid solution and modified products thereof, the annealing temperature may preferably be 300° C. to 500° C. If the components of the blocky thermoelectric material are $Bi_{2-c}Sb_cTe_{3-d}Se_d$ and doped, solid solution and modified products thereof, the annealing temperature may preferably be 300° C. to 500° C. If the components of the blocky thermoelectric material are MgAgSb and doped, solid solution and modified products thereof, the annealing temperature may preferably be 300° C. to 400° C. If the components of the blocky thermoelectric material are $Mg_3Sb_2$ and doped, solid solution and modified products thereof, the annealing temperature may preferably be 300° C. to 400° C. Further, the material may be treated by a multi-stage heating and temperature-keeping process and multiple heat treatments.

$Cu_2Se_{1-x}S_x$ (0.0≤x≤1.0) will be taken as an example to illustrate the method for preparing a thermoelectric thick film.

A temperature-varying mechanics experiment is carried out on a bulk $Cu_2Se_{1-x}S_x$ (0.0≤x≤1.0) material to obtain the brittle-to-ductile transition temperature of the material. According to different contents of S, the brittle-to-ductile transition temperature of the $Cu_2Se_{1-x}S_x$ (0.0≤x≤1.0) material is between 60° C. and 400° C.

According to the above experimental result, the bulk $Cu_2Se_{1-x}S_x$ material is heated to a temperature above the brittle-to-ductile transition temperature, the temperature is kept for 60 to 200 minutes, and rolling is started. The linear speed of the rollers is between 10 mm/s and 0.01 mm/s, and the amount of pressing of the rollers each time is between 0.1 mm and 0.0005 mm, and each time when the rollers press, the material is rolled for 1 to 100 times.

In the process of rolling, the temperature of the material is monitored by using a contact or infrared camera. When the temperature of the bulk thermoelectric material is less than the heating temperature of 5° C., rolling is stopped, and the bulk thermoelectric material is reheated. After rolling is complete, the obtained thermoelectric thick film may be selectively heat-treated (annealed) and modified in another way, so as to further regulate the properties of the thermoelectric thick film. That is, the present invention can effectively regulate the thermoelectric properties of the thermoelectric thick film by heat treatment. The temperature range of heat treatment may be 100° C. to 800° C., preferably 300° C. to 500° C. The temperature-keeping time of heat treatment may be 10 to 500 hours, preferably 100 to 300 hours. In a preferred embodiment, the heating rate and cooling rate of heat treatment may also be between 0.01° C./s and 1,000° C./s, preferably between 1° C./s and 20° C./s. Further, the material may be treated by a multi-stage heating and temperature-keeping process and multiple heat treatments.

Examples will be taken to further illustrate the present invention in detail below. It should also be understood that the following examples are only used to further illustrate the present invention rather than to limit the protection scope of the present invention. All non-essential improvements and adjustments which are made by those skilled in the art according to the above contents of the present invention shall fall within the protection scope of the present invention. The specific technological parameters of the following examples are merely one example in an appropriate range, that is, those skilled in the art can make choices within the appropriate range through the description herein, but the choices are not limited to the specific values of the following examples.

Example 1

Figure 3:
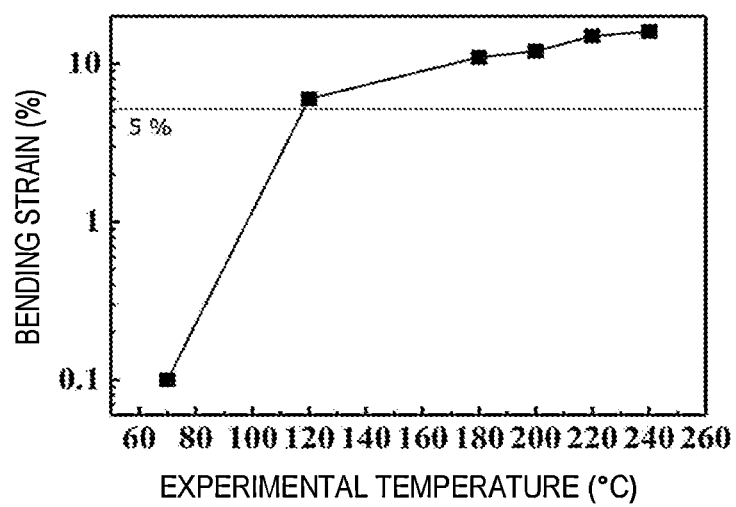
FIG. 3 shows mechanical properties of $Cu_2Se$ under room temperature and high temperature.

In example 1, $Cu_2Se$ was taken as a material to be rolled. Since $Cu_2Se$ exhibits extremely limited ductility under room temperature, it is difficult to roll $Cu_2Se$ to deform greatly. In example 1, rolling was carried out under the condition of high temperature. A $Cu_2Se$ block was first cut into bulk thermoelectric materials with thicknesses of 1 mm to 5 mm, the specific shape of which was not limited. The obtained bulk thermoelectric materials were ground smooth. It can be known according to a temperature-varying mechanics experiment (FIG. 3) that $Cu_2Se$ has good ductility at 120° C. to 240° C. Therefore, rollers of a roller press were heated to 200° C. The roller distance was adjusted, so that each $Cu_2Se$ block was clamped, and after the temperature was kept for 60 minutes, rolling was started. By controlling the amount of pressing each time at 0.001 mm, the $Cu_2Se$ block was rolled ten times when pressed, and was then further pressed. The linear speed of the rollers was 0.1 mm/s to 2.8 mm/s. In the process of rolling, a contact thermometer was always used to measure the roller temperature, and an infrared thermometer was used to measure the material temperature.

Figure 4A:
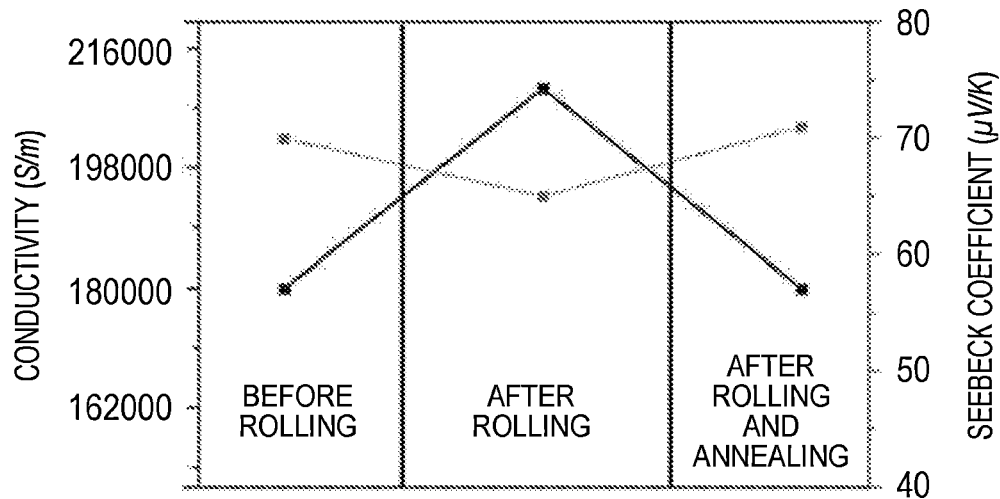
FIG. 4a and FIG. 4b show thermoelectric property graphs of $Cu_2Se$ obtained before and after rolling and after annealing.
Figure 4B:
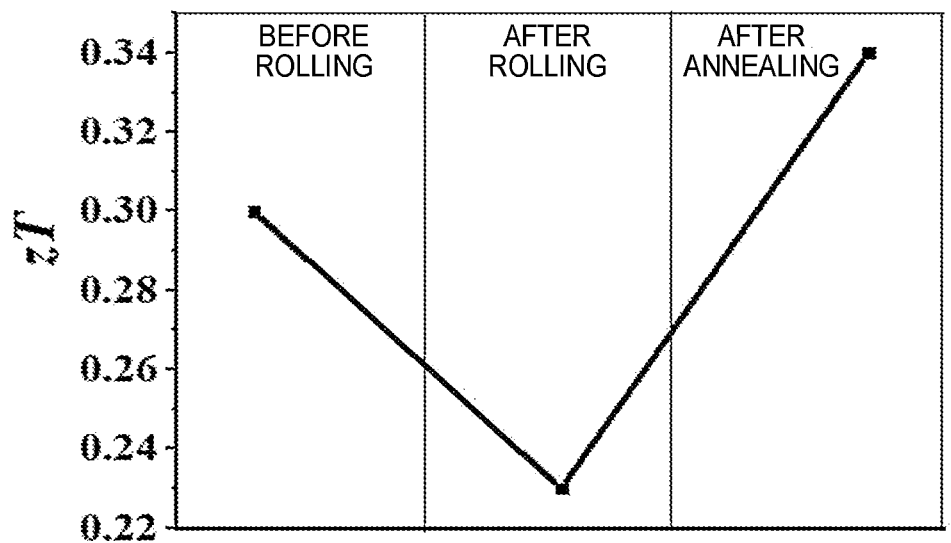

After rolling, a series of thermoelectric thick films having thicknesses of 1 mm, 0.5 mm, 0.05 mm, and 0.001 mm respectively were obtained. The electric properties of the thermoelectric thick film with the thickness of 0.05 mm were measured. The result showed that the conductivity of the thermoelectric thick film increased and the Seebeck coefficient decreased (FIG. 4a). The thermoelectric thick film with the thickness of 0.05 mm was then annealed under an annealing temperature of 400° C. for 120 hours. After annealing, the electric properties of the thermoelectric thick film, including conductivity and Seebeck coefficient, were almost the same as those of the bulk material (FIG. 4a). The thermoelectric figure of merit (zT value) of the material obtained ultimately showed that after rolling, the zT value of the material decreased from 0.3 to 0.23, and after annealing, the zT value of the material reached 0.34 (FIG. 4b). It indicates that for $Cu_2Se$, rolling and annealing can help increase the material properties.

Example 2

In example 2, $Mg_3Sb_2$ was taken as a material to be rolled. An $Mg_3Sb_2$ block was first cut into blocks with thicknesses of 1 mm to 6 mm, the specific shape of which was not limited. The blocks were ground smooth. $Mg_3Sb_2$ was rolled under 100° C., 150° C., 200° C., 300° C. and 350° C. respectively. It was found that the material would not be broken only when rolled under 300° C. and 350° C. According to the experimental results, $Mg_3Sb_2$ had good ductility at 300° C. and above. Therefore, each block was heated to 300° C. by rollers. (300° C. was the lowest rolling temperature measured according to the method described in the Summary above. The slight increase of temperature could make the material ductility better, which was beneficial to the acceleration of rolling and the reduction of material loss. The temperature could be increased, as long as the melting point was not exceeded and the machine could withstand the temperature. Of course, the lower temperature, the lower energy consumption could be.) The distance of the rollers was adjusted, so that the block was clamped quickly. By controlling the amount of pressing each time at 0.001 mm to 0.005 mm, the block was rolled seven to fifteen times when pressed, and was then further pressed. The linear speed of the rollers was 0.1 mm/s. In the process of rolling, a contact thermometer was always used to measure the roller temperature, and an infrared thermometer was used to measure the material temperature. After rolling was carried out multiple times, a thermoelectric thick film with a thickness of 0.1 mm was obtained.

Figure 5A:
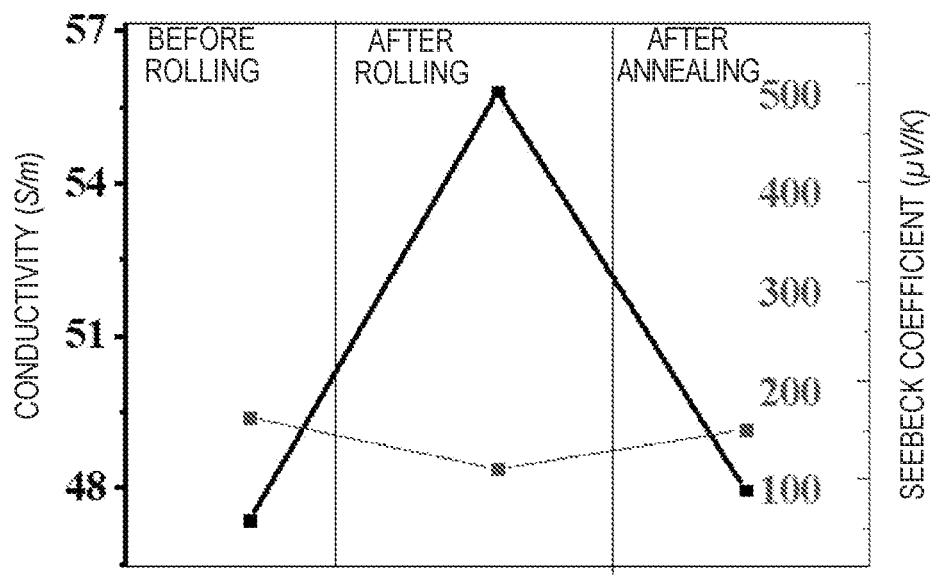
FIG. 5a and FIG. 5b show thermoelectric property graphs of $Mg_3Sb_2$ obtained before and after rolling and after annealing.
Figure 5B:
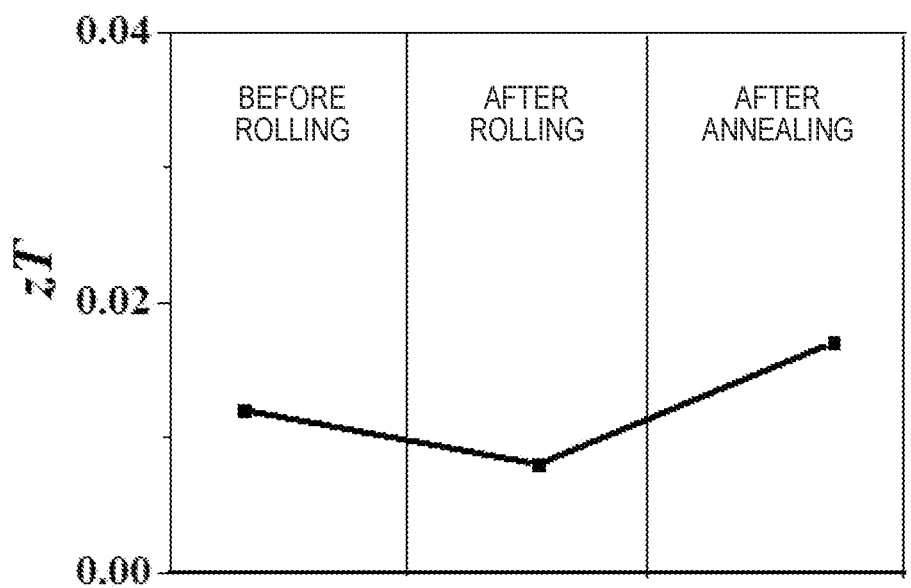

The electric properties of the thermoelectric thick film with the thickness of 0.1 mm were measured, and the result showed that the electric properties of the obtained thermoelectric thick film decreased to a certain degree (FIG. 5a). The thermoelectric thick film with the thickness of 0.1 was then annealed at an annealing temperature of 350° C. for 200 hours. After annealing, the electric properties of the material were restored to the level of the unrolled block (FIG. 5a). The thermoelectric figure of merit (zT value) of the material obtained ultimately showed that after rolling, the zT value of the material decreased from 0.012 to 0.008, and after annealing, the zT value of the material reached 0.017 (FIG. 5b). It indicates that for $Mg_3Sb_2$, rolling and annealing can help increase the material properties.

Example 3

In example 3, MgAgSb was taken as a material to be rolled. An MgAgSb block, the preparation method of which was not limited, was first cut into blocks with thicknesses of 0.5 mm to 2 mm, the specific shape of which was not limited. The blocks were ground smooth. By trying to roll the material under different temperatures (200° C., 300° C., 400° C. and 430° C.), it was known that its rolling temperature might be 400° C., and the thermoelectric material would undergo ductile deformation without break. The distance of the rollers was adjusted, so that the block was clamped. By controlling the amount of pressing each time at 0.02 mm to 0.01 mm, the $Cu_2Se$ block was rolled five to seven times when pressed, and was then further pressed. The linear speed of the rollers was 0.2 mm/s. In the process of rolling, a contact thermometer was always used to measure the roller temperature, and an infrared thermometer was used to measure the material temperature. After rolling, thermoelectric thick films having thicknesses of 1 mm, 0.5 mm, 0.08 mm, and 0.05 mm respectively were obtained.

Figure 6A:
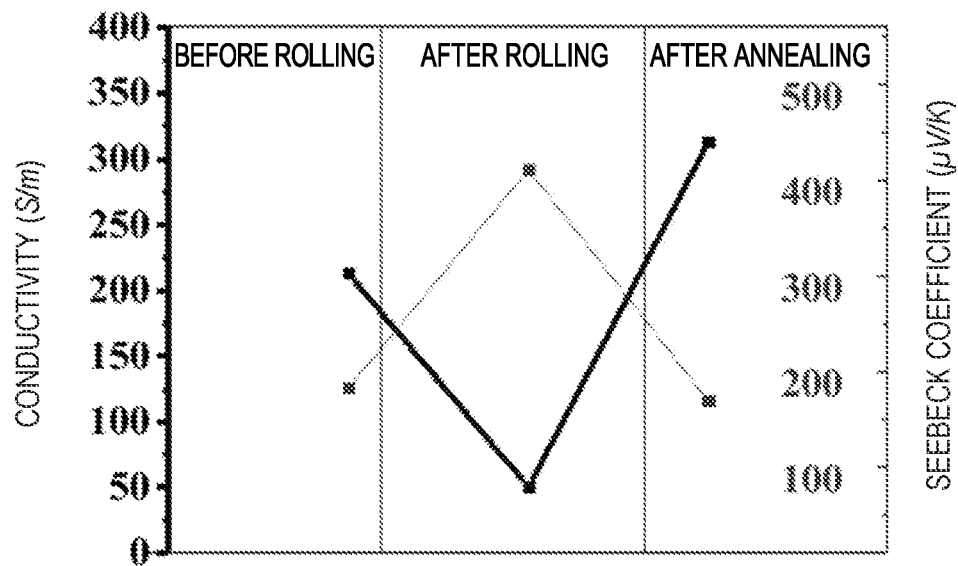
FIG. 6a and FIG. 6b show thermoelectric property graphs of MgAgSb obtained before and after rolling and after annealing.
Figure 6B:
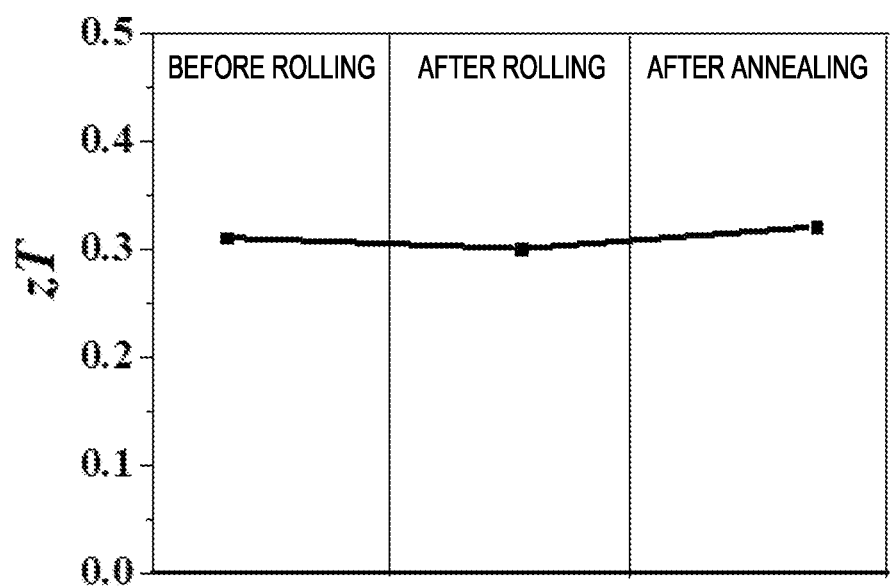

The electric properties of the thermoelectric thick film with the thickness of 0.08 mm were measured, and apparently, the electric properties of the obtained thermoelectric thick film decreased to a certain degree (FIG. 6a). The thermoelectric thick film with the thickness of 0.08 was then annealed under an annealing temperature of 350° C. for 200 hours. After annealing, the electric properties of the thermoelectric thick film were restored to the level of the unrolled block (FIG. 6a). The thermoelectric figure of merit (zT value) of the material obtained ultimately showed that after rolling, the zT value of the material decreased from 0.31 to 0.3, and after annealing, the zT value of the material reached 0.32 (FIG. 6b). It indicates that for MgAgSb, rolling and annealing are beneficial to the material properties.

Example 4

Figure 7A:
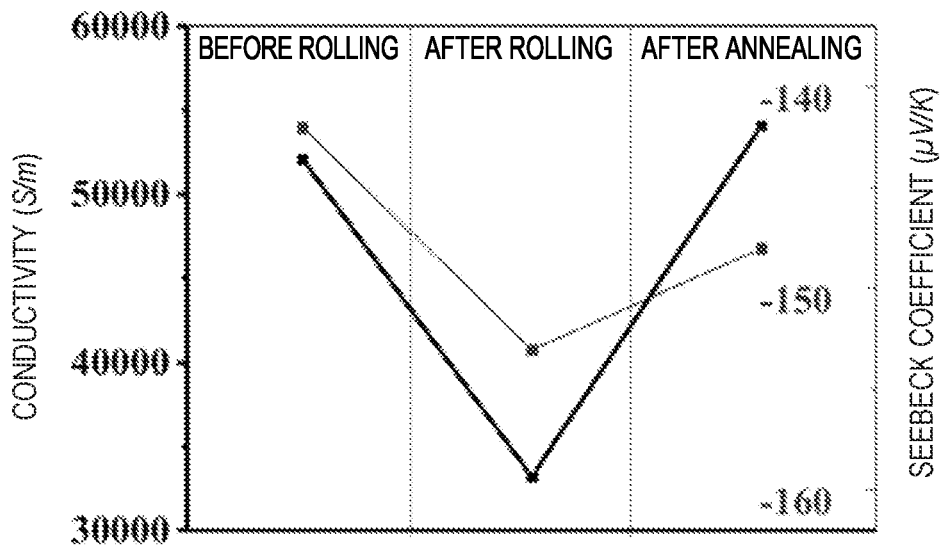
FIG. 7a and FIG. 7b show thermoelectric property graphs of $Bi_{1.5}Sb_{0.5}Te_3$ obtained before and after rolling and after annealing.
Figure 7B:
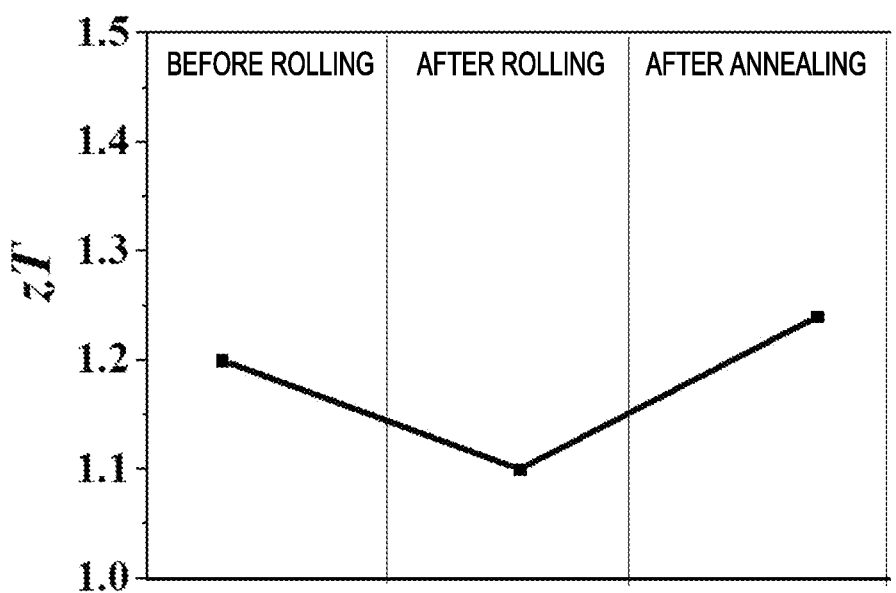

In example 4, $Bi_{1.5}Sb_{0.5}Te_3$ was taken as a material to be rolled. The bulk material was first cut into blocks with thicknesses of 0.5 mm to 1 mm. The blocks were ground smooth. By trying to roll the material under different temperatures (200° C., 240° C., 280° C., and 320° C.), it was known that under the rolling temperature of 280° C., the thermoelectric material was ductilely deformed but not break. The rollers were heated to 280° C., and the distance of the rollers was adjusted, so that the bulk thermoelectric material was clamped. By controlling the amount of pressing each time at 0.01 mm to 0.005 mm, the block was rolled ten to fifteen times when pressed, and was then further pressed. The linear speed of the rollers was 0.2 mm/s. In the process of rolling, a contact thermometer was always used to measure the roller temperature, and an infrared thermometer was used to measure the material temperature. After rolling, thermoelectric thick films having thicknesses of 0.08 mm and 0.01 mm respectively were obtained. The thermoelectric thick film with the thickness of 0.08 was annealed under an annealing temperature of 350° C. for 100 hours. The thermoelectric figure of merit (zT value) of the obtained material showed that after rolling, the zT value of the material decreased from 1.2 to 1.1, and after annealing, the zT value of the material reached 1.24 (FIG. 7a and FIG. 7b). It indicates that for $Bi_{1.5}Sb_{0.5}Te_3$, rolling and annealing can slightly improve the material properties.

Comparative Example 1

Figure 8:
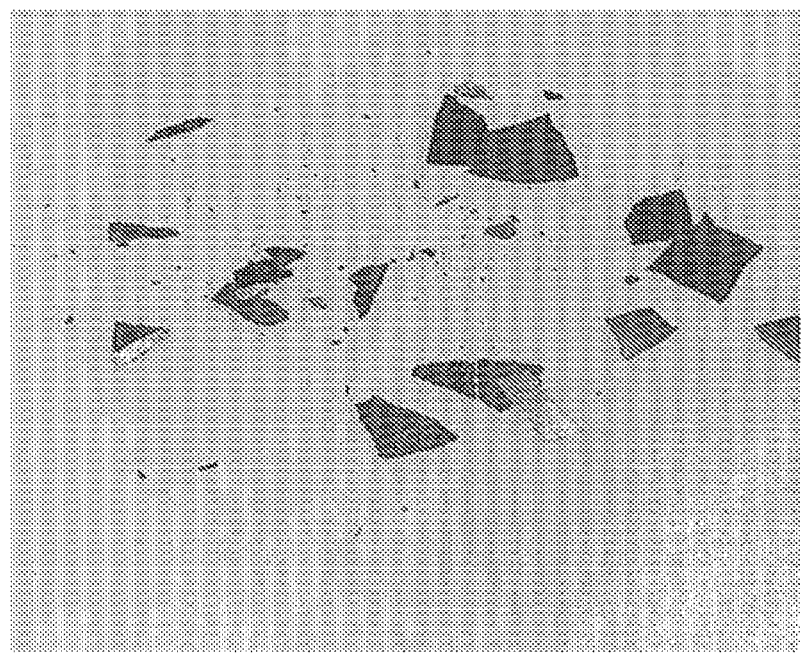
FIG. 8 shows an image of the breaking of $Cu_2Se$ by rolling under room temperature.

In order to carry out comparison to reflect the excellent technical effect of the present invention, $Cu_2Se$ was rolled under room temperature as comparative example 1. A $Cu_2Se$ bulk material was first cut and ground into a block with a thickness of 0.5 mm. The distance of the rollers was adjusted, so that the block was clamped. By controlling the amount of pressing each time at 0.001 mm, the block was rolled ten to fifteen times when pressed, and was then further pressed. The linear speed of rollers was 0.1 mm/s. It was found that $Cu_2Se$ could be slightly deformed when rolled under room temperature, compressed from 0.5 mm to 0.497 mm in thickness, with the deformation being 0.6%. However, when further rolled, the material was severely broken and crushed (FIG. 8).

Similarly, $Bi_{1.5}Sb_{0.5}Te_3$, MgAgSb, and $Mg_3Sb_2$ were rolled under room temperature according to a material thickness of 1 mm, a rolling linear speed of 0.01 mm/s, and a pressing stroke of 0.01 mm. When rolling was carried out, all these materials were severely broken and crushed by pressing carried out for the first time, just like what happened in FIG. 8. This phenomenon proves that rolling under room temperature has no potential to prepare materials brittle under room temperature into thermoelectric thick films.

In the present invention, the materials (such as $Cu_2Se_{1-x}S_x$ ($0.0 \leq x \leq 1.0$)) which are brittle under room temperature cannot bear great ductile deformation, but can only bear less than 1% of ductile deformation by rolling, and therefore have no potential to be prepared into thermoelectric thick films. By increasing temperature, the limitation of material brittleness is broken through, and the ductility of materials (such as $Cu_2Se_{1-x}S_x$ ($0.0 \leq x \leq 1.0$)) is greatly increased. The comparison of the three-point bending experiments at room temperature and high temperature shows that the ductility of $Cu_2Se$ is greatly increased after temperature is increased to 120° C. (FIG. 3), but the material is not ductilely deformed substantially under room temperature. Only when temperature is increased to the ductile deformation temperature of the material can meaningful rolling be carried out, and the material will not be broken or lost in the process of rolling.

Figure 2:
FIG. 2 shows images of a $Cu_2Se$ thick film (left) and an MgAgSb thick film (right) obtained by rolling.

As shown in FIG. 2, the above examples and comparative experiments show that materials (such as $Cu_2Se$, $Bi_{1.5}Sb_{0.5}Te_3$, and MgAgSb) which have extremely poor ductility under room temperature and cannot be rolled into thick films can be rolled into thick films with a thickness less than 0.05 mm. It should also be pointed out that the above examples are only used to illustrate the present invention rather than to limit the protection scope of the present invention. All non-essential improvements and adjustments which are made by those skilled in the art according to the above contents of the present invention shall fall within the protection scope of the present invention.

What is claimed is:

1. A method for preparing a thermoelectric thick film, comprising:
   determining a brittle-to-ductile transition temperature of a blocky thermoelectric material;
   rolling the blocky thermoelectric material within a temperature range above the brittle-to-ductile transition temperature and below a melting point, parameters of the rolling including a linear speed of rollers being 0.01 mm/s to 10 mm/s, and an amount of pressing each time of the rollers being controlled at 0.0005 mm to 0.1 mm;
   repeating the rolling of the blocky thermoelectric material to form the thermoelectric thick film with a specified thickness; and
   annealing the thermoelectric thick film with the specified thickness, a temperature of the annealing being 100° C. to 800° C., and a duration of the annealing being 10 to 500 hours.

2. The method of claim 1, further comprising determining the brittle-to-ductile transition temperature by:
   carrying out a three-point bending mechanics experiment on the blocky thermoelectric material by using a universal temperature-varying material testing machine;
   continuously increasing a testing temperature of the mechanics experiment from room temperature until the blocky thermoelectric material is ductilely deformed; and
   defining the lowest experimental temperature corresponding to a strain of the blocky thermoelectric material being greater than or equal to 5% as the brittle-to-ductile transition temperature of the blocky thermoelectric material.

3. The method of claim 1, further comprising determining the brittle-to-ductile transition temperature by:
   rolling the blocky thermoelectric material, continuously increasing a temperature of the rolling from room temperature until the blocky thermoelectric material is ductilely deformed but not broken; and
   defining the temperature of the rolling as the brittle-to-ductile transition temperature.

4. The method of claim 1, wherein the blocky thermoelectric material is selected from one of the following materials:
   (1) $Cu_wAg_{2-w}S_xSe_yTe_z$ and doped, solid solution and modified products thereof, where $0 \leq w \leq 2$, $0 \leq x \leq 1$, $0 \leq y \leq 1$, $0 \leq z \leq 1$, and $x+y+z=1$;
   (2) $Bi_{2-c}Sb_cTe_{3-d}Se_d$ and doped, solid solution and modified products thereof, where $0 \leq c \leq 2$ and $0 \leq d \leq 3$;
   (3) MgAgSb and doped, solid solution and modified products thereof; and
   (4) $Mg_3Sb_2$ and doped, solid solution and modified products thereof.

5. The method of claim 1, wherein an initial thickness of the blocky thermoelectric material is 0.01 mm to 100 mm.

6. The method of claim 1, wherein during the rolling, a temperature of the rollers and a temperature of the blocky thermoelectric material are detected, and both are controlled to be above the brittle-to-ductile transition temperature.

7. The method of claim 1, wherein the rolling is repeated 2 to 100 times.

8. The method of claim 1, wherein an atmosphere of the rolling is an air atmosphere, a nitrogen atmosphere, a vacuum atmosphere, or an inert atmosphere.

9. The method of claim 1, wherein during the annealing, a heating rate and/or cooling rate is 1° C./s to 20° C./s.

10. The method of claim 1, wherein the specified thickness of the thermoelectric thick film is 0.0001 mm to 1 mm.

11. The method of claim 1, wherein the parameters of the rolling include:
   the linear speed of the rollers being 0.1 mm/s to 5 mm/s, and the amount of pressing each time of the rollers being controlled at 0.001 mm to 0.05 mm;
   the temperature of the annealing being 300° C. to 500° C.; and
   the duration of the annealing being 100 to 300 hours.

* * * * *